(12) United States Patent
Jin

(10) Patent No.: US 11,355,730 B2
(45) Date of Patent: Jun. 7, 2022

(54) LIGHT EMITTING PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Jiangjiang Jin, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 307 days.

(21) Appl. No.: 16/613,839

(22) PCT Filed: Sep. 30, 2019

(86) PCT No.: PCT/CN2019/109424
§ 371 (c)(1),
(2) Date: Nov. 15, 2019

(87) PCT Pub. No.: WO2020/237958
PCT Pub. Date: Dec. 3, 2020

(65) Prior Publication Data
US 2021/0359261 A1    Nov. 18, 2021

(30) Foreign Application Priority Data
May 28, 2019   (CN) .......................... 201910452995.8

(51) Int. Cl.
*H01L 51/52*    (2006.01)
*H01L 27/32*    (2006.01)
*G06F 3/041*    (2006.01)

(52) U.S. Cl.
CPC ........ *H01L 51/5253* (2013.01); *G06F 3/0412* (2013.01); *H01L 27/323* (2013.01); *H01L 27/3246* (2013.01); *H01L 27/3283* (2013.01)

(58) Field of Classification Search
CPC .............. H01L 51/5253; H01L 27/323; H01L 27/3246; H01L 27/3283; G06F 3/0412
See application file for complete search history.

(56) References Cited

U.S. PATENT DOCUMENTS

| 2019/0074339 A1 | 3/2019 | Ma et al. |
| 2019/0296268 A1 | 9/2019 | Ni et al. |
| 2019/0341428 A1 * | 11/2019 | Lee ..................... H01L 27/3211 |

FOREIGN PATENT DOCUMENTS

| CN | 106450035 A | 2/2017 |
| CN | 108511614 A | 9/2018 |

* cited by examiner

*Primary Examiner* — Kyoung Lee

(57) ABSTRACT

The present invention provides a light emitting panel and a display device. The light emitting panel includes: pixel definition layers and light emitting units arranged on a substrate and spaced apart from each other; a first inorganic encapsulation layer covering the pixel definition layers and the light emitting units; an organic encapsulation layer arranged on the first inorganic encapsulation layer and provided with concave structures arranged corresponding to the pixel definition layers; a second inorganic encapsulation layer covering the organic encapsulation layer; first touch sensing layers positioned on the second inorganic encapsulation layer and arranged corresponding to the pixel definition layers; an insulating layer covering the second inorganic encapsulation layer and the first touch sensing layers; and second touch sensing layers positioned on the insulating layer and arranged corresponding to the pixel definition layers.

18 Claims, 2 Drawing Sheets

LIGHT EMITTING PANEL AND DISPLAY DEVICE

CROSS REFERENCE TO RELATED APPLICATION

This application is the National Stage of International Application No. PCT/CN2019/109424, filed Sep. 30, 2019, and titled "LIGHT EMITTING PANEL AND DISPLAY DEVICE," which claims priority to and the benefit of Chinese Application No. 201910452995.8, filed on May 28, 2019.

1. FIELD OF DISCLOSURE

The present invention relates to a field of display devices and in particular, to a light emitting panel and a display device.

2. DESCRIPTION OF RELATED ART

In recent years, organic light emitting diode (PLED) has advantages such as self-illumination, low energy consumption, wide viewing angles, rich color, and fast response, and can be used to make flexible screens. Therefore, there is a great interest for scientists and industries to develop OLED. OLED has great potential and is considered to be the next generation of display technology.

In conventional techniques, a bonding process is adopted to make a touch control portion which includes two upper and lower touch sensing layers and an insulating layer disposed between the two touch sensing layers. In consideration of the complexity of manufacturing, the touch sensing layer is directly disposed on an organic encapsulation layer, but such configuration will cause damage to a cathode or a luminescent layer of an OLED, thus reducing luminous efficiency.

Therefore, there is an urgent need to solve the problems of the conventional techniques.

SUMMARY

The present invention provides a light emitting panel and a display device, so as to prevent a cathode or a luminescent layer of an OLED from being damaged and to improve luminous efficiency.

The present invention provides a light emitting panel, comprising:

a substrate, wherein a plurality of pixel definition layers and a plurality of light emitting units are disposed on the substrate and spaced apart from each other;

a first inorganic encapsulation layer covering the pixel definition layers and the light emitting units;

an organic encapsulation layer disposed on the first inorganic encapsulation layer, wherein the organic encapsulation layer is provided with a plurality of concave structures arranged corresponding to the pixel definition layers;

a second inorganic encapsulation layer covering the organic encapsulation layer;

a plurality of first touch sensing layers disposed on the second inorganic encapsulation layer and arranged corresponding to the pixel definition layers;

an insulating layer covering the second inorganic encapsulation layer and the first touch sensing layers; and a plurality of second touch sensing layers disposed on the insulating layer and arranged corresponding to the pixel definition layers.

In the light emitting panel of the present invention, the second inorganic encapsulation layer comprises a first inorganic encapsulation sub-layer and a second inorganic encapsulation sub-layer, the second inorganic encapsulation sub-layer covers the first inorganic encapsulation sub-layer, and the second inorganic encapsulation layer is composed of a silicon nitrogen compound or a silicon oxynitride compound.

In the light emitting panel of the present invention, an atomic ratio of silicon atoms to nitrogen atoms in the first inorganic encapsulation sub-layer is greater than 8, and an atomic ratio of silicon atoms to nitrogen atoms in the second inorganic, encapsulation sub-layer is less than 8.

In the light emitting panel of the present invention, each of the concave structures is provided with a first concave portion, and a horizontal width of each first concave portion is greater than a horizontal width of each of the first touch sensing layers.

In the light emitting panel of the present invention, the first inorganic encapsulation layer is provided with a plurality of second concave portions arranged corresponding to the pixel definition layers.

In the light emitting panel of the present invention, the first touch sensing layers and the second touch sensing layers are composed of any of molybdenum, silver, titanium, copper, aluminum, a molybdenum/aluminum/molybdenum composite layer, and a titanium/aluminum/titanium composite layer.

In the light emitting panel of the present invention, the insulating layer is composed of one or more of a silicon nitride compound, a silicon oxynitride compound, and a silicon oxide compound.

In the light emitting panel of the present invention, the light emitting panel further comprises an adhesive layer, a polarization plate, and a cover plate, wherein the adhesive layer covers the insulating layer and the second touch sensing layers, and the cover plate and the polarization plate are sequentially disposed on the adhesive layer.

In the light emitting panel of the present invention, the cover plate is made of polyimide or a polyester compound.

The present invention further provides a display device, comprising a casing and a light emitting panel, wherein the light emitting panel is disposed on the casing, and the light emitting panel comprises:

a substrate, wherein a plurality of pixel definition layers and a plurality of light emitting units are spaced apart from each other on the substrate;

a first inorganic encapsulation layer covering the pixel definition layers and the light emitting units;

an organic encapsulation layer disposed on the first inorganic encapsulation layer, wherein the organic encapsulation layer is provided with a plurality of concave structures arranged corresponding to the pixel definition layers;

a second inorganic encapsulation layer covering the organic encapsulation layer;

a plurality of first touch sensing layers disposed on the second inorganic encapsulation layer and arranged corresponding to the pixel definition layers;

an insulating layer covering the second inorganic encapsulation layer and the first touch sensing layers; and a plurality of second touch sensing layers disposed on the insulating layer and arranged corresponding to the pixel definition layers, wherein the first inorganic encapsulation layer and the second inorganic encapsulation layer both have a vertical thickness ranging from 0.1 µm to 2 µm, and the pixel definition layer has a vertical thickness ranging from 2 µm to 20 µm.

In the display device of the present invention, the second inorganic encapsulation layer comprises a first inorganic encapsulation sub-layer and a second inorganic encapsulation sub-layer, the second inorganic encapsulation sub-layer covers the first inorganic encapsulation sub-layer, and the second inorganic encapsulation layer is composed of a nitrogen silicon compound or a silicon oxynitride compound.

In the display device of the present invention, an atomic ratio of silicon atoms to nitrogen atoms in the first inorganic encapsulation sub-layer is greater than 8, and an atomic ratio of silicon atoms to nitrogen atoms in the second inorganic encapsulation sub-layer is less than 8.

In the display device of the present invention, each of the concave structures is provided with a first concave portions, and a horizontal width of each first concave portion is greater than a horizontal width of each first touch sensing layer.

In the display device of the present invention, the first inorganic encapsulation layer is provided with a plurality of second concave portions arranged corresponding to the pixel definition layers.

In the display device of the present invention, the first touch sensing layers and the second touch sensing layers are composed of any of molybdenum, silver, titanium, copper, aluminum, a molybdenum/aluminum/molybdenum composite layer, and a titanium/aluminum/titanium composite layer.

In the display device of the present invention, the insulating layer is composed of one or more of a silicon nitride compound, a silicon oxynitride compound, and a silicon oxide compound.

In the display device of the present invention, the light emitting panel further comprises an adhesive layer, a polarization plate, and a cover plate, the adhesive layer covers the insulating layer and the second touch sensing layer, and the cover plate and the polarization plate are sequentially disposed on the adhesive layer.

In the display device of the present invention, the cover plate is composed of polyimide or a polyester compound.

The present invention further provides a light emitting panel, comprising:

a substrate, wherein a plurality of pixel definition layers and a plurality of light emitting units are spaced apart from each other on the substrate;

a first inorganic encapsulation layer covering the pixel definition layers and the light emitting units;

an organic encapsulation layer disposed on the first inorganic encapsulation layer, wherein the organic encapsulation layer is provided with a plurality of concave structures arranged corresponding to the pixel definition layers;

a second inorganic encapsulation layer covering the organic encapsulation layer;

a plurality of first touch sensing layers disposed on the second inorganic encapsulation layer and arranged corresponding to the pixel definition layers;

an insulating layer covering the second inorganic encapsulation layer and the first touch sensing layers; and a plurality of second touch sensing layers disposed on the insulating layer and arranged corresponding to the pixel definition layers, wherein each of the concave structures is provided with a horizontal first concave portion, a horizontal width of each of the first concave portions is greater than a horizontal width of each of the first touch sensing layers, and the first inorganic encapsulation layer is provided with a plurality of second concave portions arranged corresponding to the pixel definition layers.

In the light emitting panel of the present invention, the first touch sensing layers and the second touch sensing layers are composed of any of molybdenum, silver, titanium, copper, aluminum, a molybdenum/aluminum/molybdenum composite layer, and a titanium/aluminum/titanium composite layer, and the insulating layer is composed of one or more of a silicon nitride compound, a silicon oxynitride compound, and a silicon oxide compound.

Advantages of the present invention:

The present invention provides a light emitting panel, comprising:

a substrate, wherein a plurality of pixel definition layers and a plurality of light emitting units are disposed on the substrate and spaced apart from each other;

a first inorganic encapsulation layer covering the pixel definition layers and the light emitting units;

an organic encapsulation layer disposed on the first inorganic encapsulation layer, wherein the organic encapsulation layer is provided with a plurality of concave structures arranged corresponding to the pixel definition layers;

a second inorganic encapsulation layer covering the organic encapsulation layer;

a plurality of first touch sensing layers disposed on the second inorganic encapsulation layer and arranged corresponding to the pixel definition layers;

an insulating layer covering the second inorganic encapsulation layer and the first touch sensing layers; and a plurality of second touch sensing layers disposed on the insulating layer and arranged corresponding to the pixel definition layers.

Such configuration avoids damage to a cathode or a luminescent layer of an OLEIC, and brings the touch sensing layers closer to the luminescent layer in a vertical direction, thereby improving luminous efficiency.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work.

DETAILED DESCRIPTION OF EMBODIMENTS

Technical solutions in the embodiments of the present application will be clearly described below with reference to the accompanying drawings. It is apparent that the described embodiments are only some of the embodiments of the present application, but not all of them. All other embodiments obtained by those skilled in the art based on the embodiments of the present application without creative efforts are deemed to be within the protection scope of the present application.

In conventional techniques, a touch control portion generally includes two upper and lower touch sensing layers and an insulating layer disposed between the two touch sensing layers. In view of the complexity of manufacturing steps, the touch sensing layers are directly disposed on an organic encapsulation layer. This will cause damage to a cathode or a luminescent layer of an organic light emitting diode (OLED) and reduce luminous efficiency. In addition to that, the touch control portion is disposed at a position away from the OLED, and luminous efficiency is decreased due to an insufficient line width of a conductive electrode.

Figure 1:
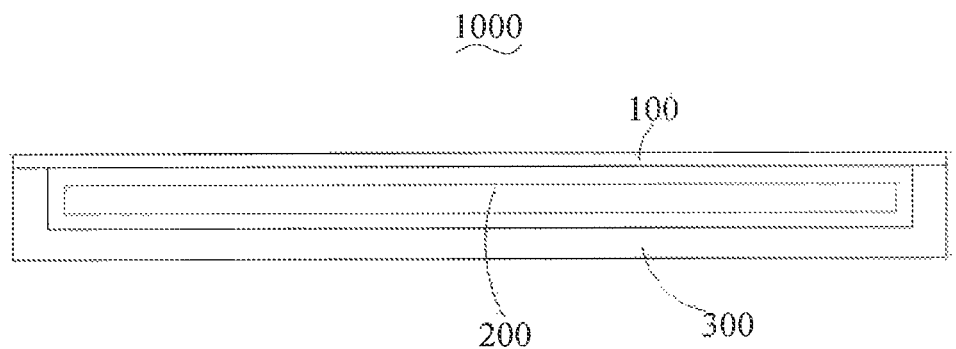
FIG. 1 is a schematic structural view illustrating a display device according to one embodiment of the present invention.

Please refer to FIG. 1, FIG. 1 is a schematic structural view illustrating a display device 1000 according to one embodiment of the present invention. The display device 1000 comprises a light emitting panel 100, a control circuit 200, and a casing 300. It should be noted that, the display device 1000 of FIG. 1 is not limited to the above-mentioned. The display device 1000 further comprises a camera, an antenna structure, a fingerprint unlocking module, and etc.

A display device is provided according to one embodiment of the present invention. The display device comprises a casing and a light emitting panel. The light emitting panel is disposed on the casing. The light emitting panel, comprising:

a substrate, wherein a plurality of pixel definition layers and a plurality of light emitting units are disposed on the substrate and spaced apart from each other;

a first inorganic encapsulation layer covering the pixel definition layers and the light emitting units;

an organic encapsulation layer disposed on the first inorganic encapsulation layer, wherein the organic encapsulation layer is provided with a plurality of concave structures arranged corresponding to the pixel definition layers;

a second inorganic encapsulation layer covering the organic encapsulation layer;

a plurality of first touch sensing layers disposed on the second inorganic encapsulation layer and arranged corresponding to the pixel definition layers;

an insulating layer covering the second inorganic encapsulation layer and the first touch sensing layers; and a plurality of second touch sensing layers disposed on the insulating layer and arranged corresponding to the pixel definition layers. A vertical thickness of the first inorganic encapsulation layer and a vertical thickness of the second inorganic encapsulation layer 203 are 0.1 to 2 μm, and a vertical thickness of the pixel definition layer 101 is 2 to 20 μm.

The second inorganic encapsulation layer comprises a first inorganic encapsulation sub-layer and a second inorganic encapsulation sub-layer, the second inorganic encapsulation sub-layer covers the first inorganic encapsulation sub-layer, and the second inorganic encapsulation layer is composed of a silicon nitrogen compound or a silicon oxynitride compound.

An atomic ratio of silicon atoms to nitrogen atoms in the first inorganic encapsulation sub-layer is greater than 8, and an atomic ratio of silicon atoms to nitrogen atoms in the second inorganic encapsulation sub-layer is less than 8.

Each of the concave structures is provided with a first concave portion, and a horizontal width of each first concave portion is greater than a horizontal width of each of the first touch sensing layers.

The first inorganic encapsulation layer is provided with a plurality of second concave portions arranged corresponding to the pixel definition layers.

The first touch sensing layers and the second touch sensing layers are composed of any of molybdenum, silver, titanium, copper, aluminum, a molybdenum/aluminum/molybdenum composite layer, and a titanium/aluminum/titanium composite layer.

The insulating layer is composed of one or more of a silicon nitride compound, a silicon oxynitride compound, and a silicon oxide compound.

The light emitting panel further comprises an adhesive layer, a polarization plate, and a cover plate, wherein the adhesive layer covers the insulating layer and the second touch sensing layers, and the cover plate and the polarization plate are sequentially disposed on the adhesive layer.

The cover plate is made of polyimide or a polyester compound.

The light emitting panel 100 is disposed on the casing 300.

In some embodiments, the light emitting panel 100 is fixed onto the casing 300. The light emitting panel 100 and the casing 300 together form a sealed space to accommodate a control circuit 200 and other devices.

In some embodiments, the casing 300 is made of a flexible material such as plastic or silicone.

The control circuit 200 is installed in the casing 300. The control circuit 200 can be a motherboard of the display device 1000. The control circuit 200 can be integrated with one, two, or more of a battery, an antenna structure, a microphone, a speaker, a headphone interface, a universal serial bus interface, a camera, a distance sensor, an ambient light sensor, a receiver, and a processor.

The light emitting panel 100 is mounted in the housing 300, and the light emitting panel 100 is electrically connected to the control circuit 200 to form a display surface of the display device 1000. The light emitting panel 100 may include a display area and a non-display area. The display area of the display device 1000 can be used to display images or configured for a user to perform touch manipulation. The non-display area can be used to set various functional components.

The present invention further provides a light emitting panel, comprising:

a substrate, wherein a plurality of pixel definition layers and a plurality of light emitting units are disposed on the substrate and spaced apart from each other;

a first inorganic encapsulation layer covering the pixel definition layers and the light emitting units;

an organic encapsulation layer disposed on the first inorganic encapsulation layer, wherein the organic encapsulation layer is provided with a plurality of concave structures arranged corresponding to the pixel definition layers;

a second inorganic encapsulation layer covering the organic encapsulation layer;

a plurality of first touch sensing layers disposed on the second inorganic encapsulation layer and arranged corresponding to the pixel definition layers; an insulating layer covering the second inorganic encapsulation layer and the first touch sensing layers; and a plurality of second touch sensing layers disposed on the insulating layer and arranged corresponding to the pixel definition layers.

The second inorganic encapsulation layer comprises a first inorganic encapsulation sub-layer and a second inorganic encapsulation sub-layer, the second inorganic encapsulation sub-layer covers the first inorganic encapsulation sub-layer, and the second inorganic encapsulation layer is composed of a silicon nitrogen compound or a silicon oxynitride compound.

An atomic ratio of silicon atoms to nitrogen atoms in the first inorganic encapsulation sub-layer is greater than 8, and an atomic ratio of silicon atoms to nitrogen atoms in the second inorganic encapsulation sub-layer is less than 8.

Each of the concave structures is provided with a first concave portion, and a horizontal width of each first concave portion is greater than a horizontal width of each of the first touch sensing layers.

The first inorganic encapsulation layer is provided with a plurality of second concave portions arranged corresponding to the pixel definition layers.

The first touch sensing layers and the second touch sensing layers are composed of any of molybdenum, silver, titanium, copper, aluminum, a molybdenum/aluminum/molybdenum composite layer, and a titanium/aluminum/titanium composite layer.

The insulating layer is composed of one or more of a silicon nitride compound, a silicon oxynitride compound, and a silicon oxide compound.

The light emitting panel further comprises an adhesive layer, a polarization plate, and a cover plate, wherein the adhesive layer covers the insulating layer and the second touch sensing layers, and the cover plate and the polarization plate are sequentially disposed on the adhesive layer.

The cover plate is made of polyimide or a polyester compound.

Figure 2:
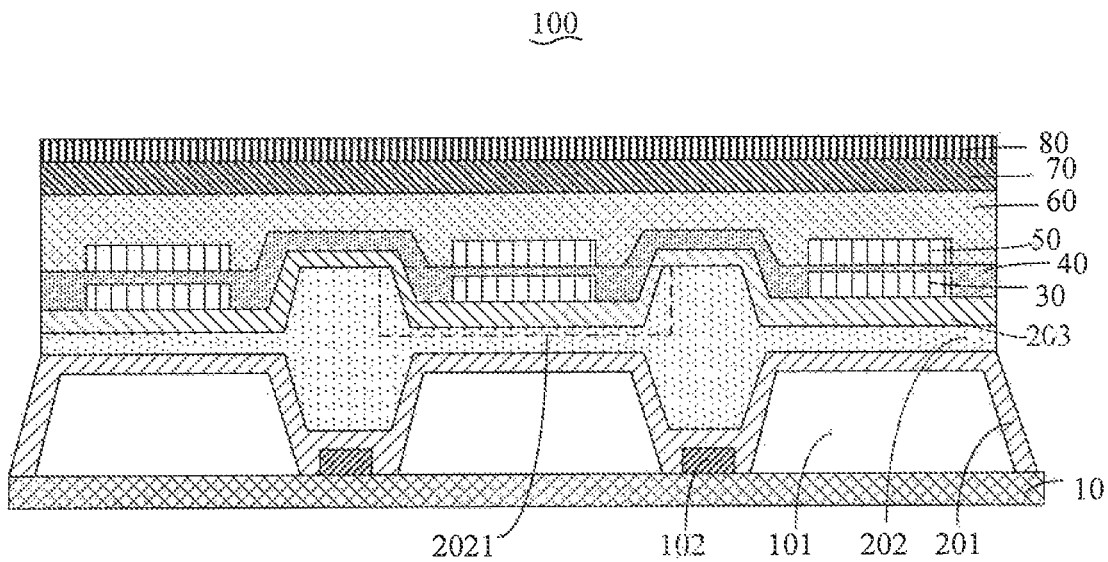
FIG. 2 is a schematic structural view illustrating a light emitting panel according to one embodiment of the present invention.

Please refer to FIG. 2. FIG. 2 is a schematic structural view illustrating a light emitting panel 100 according to one embodiment of the present invention. The light emitting panel 100, comprising:

a substrate 10, wherein a plurality of pixel definition layers 101 and a plurality of light emitting units 102 are disposed on the substrate 10 and spaced apart from each other;

a first inorganic encapsulation layer 201 covering the pixel definition layers 101 and the light emitting units 102;

an organic encapsulation layer 202 disposed on the first inorganic encapsulation layer 20, wherein the organic encapsulation layer 202 is provided with a plurality of concave structures 2021 arranged corresponding to the pixel definition layers 101;

a second inorganic encapsulation layer 203 covering the organic encapsulation layer 202;

a plurality of first touch sensing layers 30 disposed on the second inorganic encapsulation layer 203 and arranged corresponding to the pixel definition layers 101;

an insulating layer 40 covering the second inorganic encapsulation layer 203 and the first touch sensing layers 30; and a plurality of second touch sensing layers 50 disposed on the insulating layer 40 and arranged corresponding to the pixel definition layers 101.

It should be noted that, the first touch sensing layers 30 are disposed on the second inorganic encapsulation layer 203, thus avoiding a need to use an alkaline solution to fabricate the first touch sensing layers 30 to cause damage to a cathode or a luminescent layer of an OLED. The first inorganic encapsulation layer 201, the organic encapsulation layer 202, and the second inorganic encapsulation layer 203 are basic encapsulating structures. The first inorganic encapsulation layer 201 and the second inorganic encapsulation layer 203 are generally deposited and formed by chemical vapor deposition (CVD). The organic encapsulation layer 202 is generally formed by ink jet printing (IJP).

The organic encapsulation layer 202 is provided with the concave structures 2021 arranged corresponding to the pixel definition layers 101, so that the second inorganic encapsulation layer 203 subsequently formed also has recessed portions arranged corresponding to the concave structures 2021. The first touch sensing layers 30 are disposed on the recessed portions, so that touch control portions are closer to the light emitting units 102 in a vertical direction. As a result, the touch control portions can be brought closer to the OLED, and a line width of a conductive electrode is increased, thereby improving luminous efficiency.

The light emitting units 102 are pixel regions, and are generally red (R), green (G), and blue (B) pixel regions, but are not limited to R, C, B, and W. The light emitting units 102 are isolated from each other by the pixel definition layers 101.

In some embodiments, the light emitting panel 100 further comprises an adhesive layer 60, a polarization plate 70, and a cover plate 80, wherein the adhesive layer 60 covers the insulating layer 40 and the second touch sensing layers 50, and the cover plate 80 and the polarization plate 70 are sequentially disposed on the adhesive layer 60. The cover plate 80 is composed of polyimide or a polyester compound.

The first touch sensing layer 30 and the second touch sensing layer 50 are composed of any of molybdenum, silver, titanium, copper, aluminum, a molybdenum/aluminum/molybdenum composite layer, and a titanium/aluminum/titanium composite layer.

In some embodiments, the insulating layer 40 is composed of one or more of a silicon nitride compound, a silicon oxynitride compound, and a silicon oxide compound.

In some embodiments, the organic encapsulation layer 202 is composed of one or more of acryl, epoxy, and silicone compounds.

Figure 3:
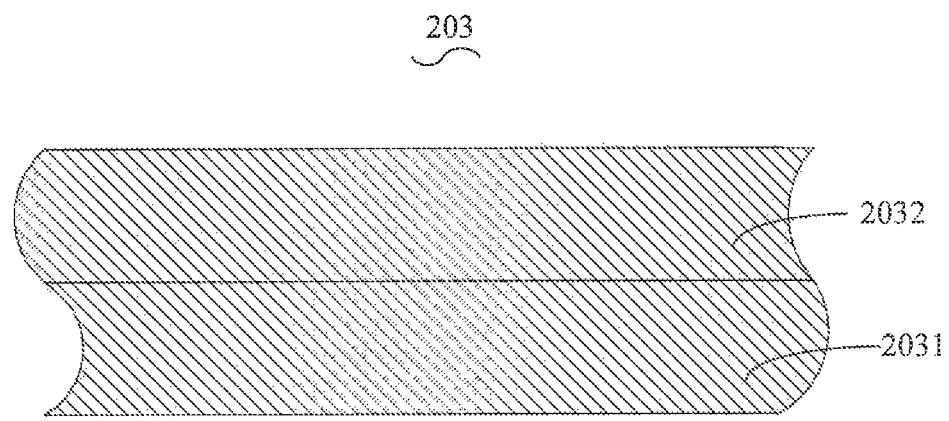
FIG. 3 is a partial enlarged view illustrating a second inorganic encapsulation layer of the light emitting panel according to one embodiment of the present invention.

Some embodiments are shown in FIG. 3. FIG. 3 is a partial enlarged view illustrating the second inorganic encapsulation layer 203 of the light emitting panel 100 according to one embodiment of the present invention. The second inorganic encapsulation layer 203 comprises a first inorganic encapsulation sub-layer 2031 and a second inorganic encapsulation sub-layer 2032, the second inorganic encapsulation sub-layer 2032 covers the first inorganic encapsulation sub-layer 2031, and the second inorganic encapsulation layer 203 is composed of a silicon nitrogen compound or a silicon oxynitride compound.

In some embodiments, an atomic ratio of silicon atoms to nitrogen atoms in the first inorganic encapsulation sub-layer 2031 is greater than 8, and an atomic ratio of silicon atoms to nitrogen atoms in the second inorganic encapsulation sub-layer 2032 is less than 8.

Specifically, the atomic ratios of silicon atoms to nitrogen atoms in the first inorganic encapsulation sub-layer 2031 and the second inorganic encapsulation sub-layer 2032 defined herein are to improve the water and oxygen barrier properties of the second inorganic encapsulation layer 203.

In some embodiments, a vertical thickness of the first inorganic encapsulation layer and a vertical thickness of the second inorganic encapsulation layer 203 are 0.1 to 2 μm, and a vertical thickness of the pixel definition layer 101 is 2 to 20 μm. A vertical thickness of the organic encapsulation layer 202 in positions corresponding to the pixel definition layers is at least 1 μm less than a vertical thickness of the organic encapsulation layer 202 in positions corresponding to the light emitting units.

Figure 4:
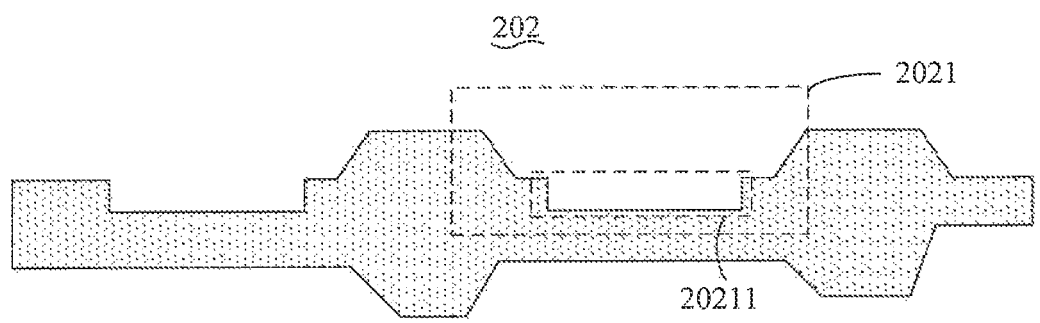
FIG. 4 is a schematic structural view illustrating an organic encapsulation layer in the light emitting panel according to one embodiment of the present invention.

FIG. 4 is a schematic structural view of the organic encapsulation layer 202 in the light emitting panel 100 according to some embodiments of the present invention.

Each of the concave structures 2021 is provided with a first concave portion 20211, and a horizontal width of each first concave portion 20211 is greater than a horizontal width of each of the first touch sensing layers 30.

It can be understood that the first concave portion 20211 is arranged in the concave structure 2021, so that the first touch sensing layer 30 can be disposed just inside the first concave portion 20211 in subsequent steps; a horizontal width of the first concave portion 20211 is greater than a horizontal width of the first touch sensing layer 30, so that the second inorganic encapsulation layer 203 or the insulating layer 40 may also be disposed in the first concave portion 20211 in subsequent steps, and alignment accuracy between the first touch sensing layer 30 and the second touch sensing layer 50 is improved during manufacturing processes.

Figure 5:
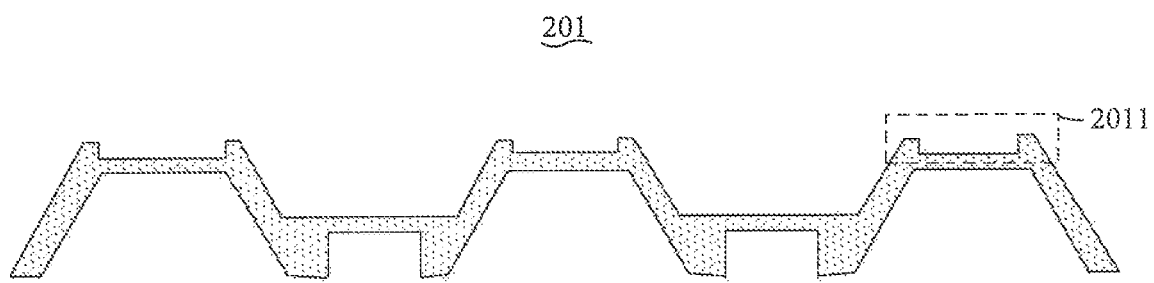
FIG. 5 is a schematic structural view illustrating a first inorganic encapsulation layer in the light emitting panel according to one embodiment of the present invention.

FIG. 5 is a schematic structural view illustrating the first inorganic encapsulation layer 201 of the light emitting panel 100 according to some embodiments of the present invention. The first inorganic encapsulation layer 201 is provided with a plurality of second concave portions 2011 arranged corresponding to the pixel definition layers 101.

An effect of arranging the second concave portions 2011 in the first inorganic encapsulation layer 201 in positions corresponding to the pixel defining layers 101 is the same as an effect of arranging the first concave portions 20211 in the concave structures 2021. The effect is to make the first touch sensing layers 30 be disposed in the first concave portions 20211 during subsequent steps, thereby improving alignment precision between the first touch sensing layers 30 and the second touch sensing layers 50 during manufacturing.

A light emitting panel is provided according to one embodiment of the present invention, comprising:

a substrate, wherein a plurality of pixel definition layers and a plurality of light emitting units are spaced apart from each other on the substrate;

a first inorganic encapsulation layer covering the pixel definition layers and the light emitting units;

an organic encapsulation layer disposed on the first inorganic encapsulation layer, wherein the organic encapsulation layer is provided with a plurality of concave structures arranged corresponding to the pixel definition layers;

a second inorganic encapsulation layer covering the organic encapsulation layer;

a plurality of first touch sensing layers disposed on the second inorganic encapsulation layer and arranged corresponding to the pixel definition layers;

an insulating layer covering the second inorganic encapsulation layer and the first touch sensing layers; and a plurality of second touch sensing layers disposed on the insulating layer and arranged corresponding to the pixel definition layers, wherein each of the concave structures is provided with a first concave portion, a horizontal width of each of the first concave portions is greater than a horizontal width of each of the first touch sensing layers, and the first inorganic encapsulation layer is provided with a plurality of second concave portions arranged corresponding to the pixel definition layers.

The first touch sensing layer and the second touch sensing layer are composed of any of molybdenum, silver, titanium, copper, aluminum, a molybdenum/aluminum/molybdenum composite layer, and a titanium/aluminum/titanium composite layer, and the insulating layer consists of one or more of a silicon nitride compound, a silicon oxynitride compound, and a silicon oxide compound.

A light emitting panel 100 is provided according to one embodiment of the present invention, comprising:

a substrate 10, wherein a plurality of pixel definition layers 101 and a plurality of light emitting units 102 are spaced apart from each other on the substrate 10;

a first inorganic encapsulation layer 201 covering the pixel definition layers 101 and the light emitting units 102;

an organic encapsulation layer 202 disposed on the first inorganic encapsulation layer 20, wherein the organic encapsulation layer 202 is provided with a plurality of concave structures 2021 arranged corresponding to the pixel definition layers 101;

a second inorganic encapsulation layer 203 covering the organic encapsulation layer 30;

a plurality of first touch sensing layers 30 disposed on the second inorganic encapsulation layer 203 and arranged corresponding to the pixel definition layers 101;

an insulating layer 40 covering the second inorganic encapsulation layer 203 and the first touch sensing layers 30; and a plurality of second touch sensing layers 50 disposed on the insulating layer 40 and arranged corresponding to the pixel definition layers 101. Therefore, a touch control portion constituted by the first touch sensing layers 30, the insulating layer 40, and the second touch sensing layers 50 is closer to the light emitting units 102 in a vertical direction. Therefore, the touch control portion is close to OLED, and a line width of a conductive electrode is improved, thereby improving luminous efficiency.

The light emitting panel, the manufacturing method thereof, and the display device are described above in detail. The principles and implementations of the present application are described in the specific embodiments. The description of the above embodiments is only for ease of understanding of the present application and its main ideas. Those skilled in the art can modify the technical solutions described in the foregoing embodiments, or change some of the technical features. These modifications and changes are deemed to be within the protection scope of the present application.

What is claimed is:

1. A light emitting panel, comprising:
   a substrate, wherein a plurality of pixel definition layers and a plurality of light emitting units are disposed on the substrate and spaced apart from each other;
   a first inorganic encapsulation layer covering the pixel definition layers and the light emitting units;
   an organic encapsulation layer disposed on the first inorganic encapsulation layer, wherein the organic encapsulation layer is provided with a plurality of concave structures arranged corresponding to the pixel definition layers;
   a second inorganic encapsulation layer covering the organic encapsulation layer, wherein the second inorganic encapsulation layer comprises a first inorganic encapsulation sub-layer and a second inorganic encapsulation sub-layer, the second inorganic encapsulation sub-layer covers the first inorganic encapsulation sub-layer, and the second inorganic encapsulation layer is composed of a silicon nitrogen compound or a silicon oxynitride compound;
   a plurality of first touch sensing layers disposed on the second inorganic encapsulation layer and arranged corresponding to the pixel definition layers;
   an insulating layer covering the second inorganic encapsulation layer and the first touch sensing layers; and
   a plurality of second touch sensing layers disposed on the insulating layer and arranged corresponding to the pixel definition layers.

2. The light emitting panel according to claim 1, wherein an atomic ratio of silicon atoms to nitrogen atoms in the first inorganic encapsulation sub-layer is greater than 8, and an atomic ratio of silicon atoms to nitrogen atoms in the second inorganic encapsulation sub-layer is less than 8.

3. The light emitting panel according to claim 1, wherein each of the concave structures is provided with a first concave portion, and a horizontal width of each first concave portion is greater than a horizontal width of each of the first touch sensing layers.

4. The light emitting panel according to claim 1, wherein the first inorganic encapsulation layer is provided with a plurality of second concave portions arranged corresponding to the pixel definition layers.

5. The light emitting panel according to claim 1, wherein the first touch sensing layers and the second touch sensing layers are composed of any of molybdenum, silver, titanium, copper, aluminum, a molybdenum/aluminum/molybdenum composite layer, and a titanium/aluminum/titanium composite layer.

6. The light emitting panel according to claim 1, wherein the insulating layer is composed of one or more of a silicon nitride compound, a silicon oxynitride compound, or a silicon oxide compound.

7. The light emitting panel according to claim 1, further comprising an adhesive layer, a polarization plate, and a cover plate, wherein the adhesive layer covers the insulating layer and the second touch sensing layers, and the cover plate and the polarization plate are sequentially disposed on the adhesive layer.

8. The light emitting panel according to claim 7, wherein the cover plate is made of polyimide or a polyester compound.

9. A display device, comprising a casing and a light emitting panel, wherein the light emitting panel is disposed on the casing, and the light emitting panel comprises:
　a substrate, wherein a plurality of pixel definition layers and a plurality of light emitting units are spaced apart from each other on the substrate;
　a first inorganic encapsulation layer covering the pixel definition layers and the light emitting units;
　an organic encapsulation layer disposed on the first inorganic encapsulation layer, wherein the organic encapsulation layer is provided with a plurality of concave structures arranged corresponding to the pixel definition layers;
　a second inorganic encapsulation layer covering the organic encapsulation layer, wherein the second inorganic encapsulation layer comprises a first inorganic encapsulation sub-layer and a second inorganic encapsulation sub-layer, the second inorganic encapsulation sub-layer covers the first inorganic encapsulation sub-layer, and the second inorganic encapsulation layer is composed of a nitrogen silicon compound or a silicon oxynitride compound;
　a plurality of first touch sensing layers disposed on the second inorganic encapsulation layer and arranged corresponding to the pixel definition layers;
　an insulating layer covering the second inorganic encapsulation layer and the first touch sensing layers; and
　a plurality of second touch sensing layers disposed on the insulating layer and arranged corresponding to the pixel definition layers, wherein the first inorganic encapsulation layer and the second inorganic encapsulation layer both have a vertical thickness ranging from 0.1 µm to 2 µm, and the pixel definition layer has a vertical thickness ranging from 2 µm to 20 µm.

10. The display device according to claim 9, wherein an atomic ratio of silicon atoms to nitrogen atoms in the first inorganic encapsulation sub-layer is greater than 8, and an atomic ratio of silicon atoms to nitrogen atoms in the second inorganic encapsulation sub-layer is less than 8.

11. The display device according to claim 9, wherein each of the concave structures is provided with a first concave portions, and a horizontal width of each first concave portion is greater than a horizontal width of each first touch sensing layer.

12. The display device according to claim 9, wherein the first inorganic encapsulation layer is provided with a plurality of second concave portions arranged corresponding to the pixel definition layers.

13. The display device according to claim 9, wherein the first touch sensing layers and the second touch sensing layers are composed of any of molybdenum, silver, titanium, copper, aluminum, a molybdenum/aluminum/molybdenum composite layer, and a titanium/aluminum/titanium composite layer.

14. The display device according to claim 9, wherein the insulating layer is composed of one or more of a silicon nitride compound, a silicon oxynitride compound, or a silicon oxide compound.

15. The display device according to claim 9, wherein the light emitting panel further comprises an adhesive layer, a polarization plate, and a cover plate, the adhesive layer covers the insulating layer and the second touch sensing layer, and the cover plate and the polarization plate are sequentially disposed on the adhesive layer.

16. The display device according to claim 15, wherein the cover plate is composed of polyimide or a polyester compound.

17. A light emitting panel, comprising:
　a substrate, wherein a plurality of pixel definition layers and a plurality of light emitting units are spaced apart from each other on the substrate;
　a first inorganic encapsulation layer covering the pixel definition layers and the light emitting units;
　an organic encapsulation layer disposed on the first inorganic encapsulation layer, wherein the organic encapsulation layer is provided with a plurality of concave structures arranged corresponding to the pixel definition layers;
　a second inorganic encapsulation layer covering the organic encapsulation layer, wherein the second inorganic encapsulation layer comprises a first inorganic encapsulation sub-layer and a second inorganic encapsulation sub-layer, the second inorganic encapsulation sub-layer covers the first inorganic encapsulation sub-layer, and the second inorganic encapsulation layer is composed of a silicon nitrogen compound or a silicon oxynitride compound;
　a plurality of first touch sensing layers disposed on the second inorganic encapsulation layer and arranged corresponding to the pixel definition layers;
　an insulating layer covering the second inorganic encapsulation layer and the first touch sensing layers; and
　a plurality of second touch sensing layers disposed on the insulating layer and arranged corresponding to the pixel definition layers, wherein each of the concave structures is provided with a first concave portion, a horizontal width of each of the first concave portions is greater than a horizontal width of each of the first touch sensing layers, and the first inorganic encapsulation layer is provided with a plurality of second concave portions arranged corresponding to the pixel definition layers.

18. The light emitting panel according to claim 17, wherein the first touch sensing layers and the second touch sensing layers are composed of any of molybdenum, silver, titanium, copper, aluminum, a molybdenum/aluminum/molybdenum composite layer, and a titanium/aluminum/titanium composite layer, and the insulating layer is composed of one or more of a silicon nitride compound, a silicon oxynitride compound, and a silicon oxide compound.

* * * * *